(12) United States Patent
Gou (10) Patent No.: US 7,733,709 B2
(45) Date of Patent: Jun. 8, 2010

(54) SEMICONDUCTOR MEMORY DEVICE WITH INTERNAL VOLTAGE GENERATING CIRCUIT AND METHOD FOR OPERATING THE SAME

(75) Inventor: Ja-Seung Gou, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 220 days.

(21) Appl. No.: 12/005,851

(22) Filed: Dec. 28, 2007

(65) Prior Publication Data

US 2009/0097333 A1 Apr. 16, 2009

(30) Foreign Application Priority Data

Oct. 12, 2007 (KR) .................... 10-2007-0102990

(51) Int. Cl.
*G11C 5/14* (2006.01)
(52) U.S. Cl. .................. 365/189.09; 365/189.07; 365/189.08
(58) Field of Classification Search ........... 365/189.09, 365/189.07, 189.08, 226
See application file for complete search history.

(56) References Cited

U.S. PATENT DOCUMENTS 6,628,555 B2 * 9/2003 Kondo et al. ........... 365/189.09
7,042,796 B2 * 5/2006 Kim et al. .............. 365/230.06
7,315,195 B2 * 1/2008 Park ...................... 327/536
7,538,600 B2 * 5/2009 Lee ....................... 327/536

FOREIGN PATENT DOCUMENTS

KR    10-0761372 B1    9/2007
KR    10-2007-0095677 A    10/2007

* cited by examiner

*Primary Examiner*—Richard Elms
*Assistant Examiner*—Hien N Nguyen
(74) *Attorney, Agent, or Firm*—Blakely, Sokoloff, Taylor & Zafman LLP (57) ABSTRACT

Semiconductor memory device with internal voltage generating circuit and method for operating the same includes a high voltage detecting circuit configured to detect a voltage level of a high voltage and activate a pumping determining signal when the voltage level of the high voltage is below a predetermined level; a pumping circuit configured to perform a pumping operation in response to the pumping determining signal and an active signal; and an auxiliary pumping circuit configured to perform the pumping operation in response to the pumping determining signal and a bank active pulse signal.

20 Claims, 5 Drawing Sheets

SEMICONDUCTOR MEMORY DEVICE WITH INTERNAL VOLTAGE GENERATING CIRCUIT AND METHOD FOR OPERATING THE SAME

CROSS-REFERENCE TO RELATED APPLICATIONS

The present invention claims priority of Korean patent application number 10-2007-0102990, filed on Oct. 12, 2007, which is incorporated by reference in its entirety.

BACKGROUND OF THE INVENTION

The present invention relates to an internal voltage generating circuit in a semiconductor memory device, and more particularly, to an internal voltage generating circuit for pumping a power supply voltage to generate a high voltage used in a semiconductor memory device, and a method for operating the same.

In a system with a plurality of semiconductor devices, a semiconductor memory device is used as data storage. The semiconductor memory device outputs data corresponding to addresses received from a data processor, e.g., a central processing unit (CPU), or stores data received from the data processor into unit cells corresponding to addresses inputted together with the data.

As the integration density of the semiconductor memory device increases, circuits are designed in accordance with a sub-micron or nano-scale design rule. Components of the memory circuits are extremely scaled down. As the operating frequency of the CPU increases, a semiconductor memory device is designed such that it can operate at a high frequency. To this end, an operating voltage must also be lowered. For example, a power supply voltage of less than 1.5 V is used in a double data rate—version 3 (DDR3) or higher-performance synchronous semiconductor memory device, which are considered as next generation memory devices.

The operating voltage of the next generation semiconductor memory device decreases and different internal voltages are required for supporting a variety of operations within the semiconductor memory device. It is difficult and inefficient to receive the operating voltage and the different internal voltages from the outside. For this reason, an internal voltage generating circuit is separately provided in the semiconductor memory device. The internal voltage generating circuit generates internal voltages according to an external power supply voltage. A voltage level of the internal voltage may be substantially equal to or different from that of the external power supply voltage. For example, the internal voltage may be ½ times, ¼ times or two times the voltage level of the external power supply voltage.

The importance of on-chip high voltage generating circuits is increasing. The high voltage generating circuit generates a high voltage higher than the power supply voltage. The high voltage generating circuit is adopted for driving word lines connected to unit cells in the semiconductor memory device. In addition, the high voltage is used as a driving voltage of a data output buffer.

With the high integration of the semiconductor memory device, the number of banks increases like 4 banks, 8 banks, 16 banks, etc. A frequency of a clock signal increases with an increasing operating speed of the memory device. In spite of the high integration of the semiconductor memory device, the chip size increases with an increasing storage capacity of the semiconductor memory device. In order to maintain a high voltage VPP at a voltage level higher than a predetermined level, a pumping circuit is enabled according to a detected voltage level of a high voltage VPP. However, as the chip size increases, an operation margin for generating the high voltage VPP through the pumping operation is reduced by a delay time taken to transfer the high voltage VPP to the pumping circuit and a high-frequency clock signal. Further, since the size of a capacitor is reduced with an increasing net die, it is difficult to stabilize the voltage level of the high voltage VPP.

Figure 1:
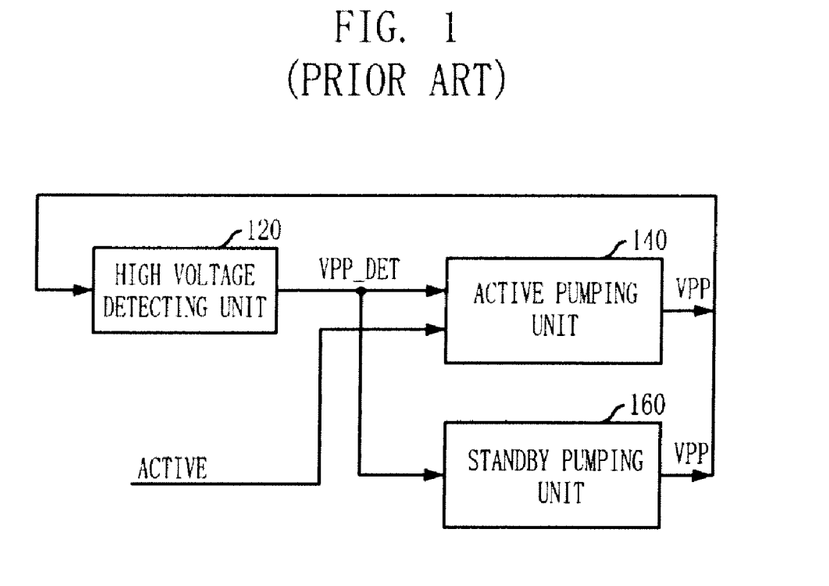
FIG. 1 is a block diagram of a conventional semiconductor memory device.

FIG. 1 is a block diagram of a conventional semiconductor memory device.

Referring to FIG. 1, the semiconductor memory device includes a high voltage detecting unit 120, an active pumping unit 140, and a standby pumping unit 160. The high voltage detecting unit 120 detects a voltage level of a high voltage VPP and outputs a pumping determining signal VPP_DET of a logic high level for enabling the pumping units when the detected voltage level of the high voltage VPP is below a predetermined level. Also, the high voltage detecting unit 120 outputs a pumping determining signal VPP_DET of a logic low level when the detected voltage level of the high voltage VPP is above the predetermined level. The pumping determining signal VPP_DET is transferred to the active pumping unit 140 and the standby pumping unit 160. The active pumping unit 140 or the standby pumping unit 160 is enabled to generate the high voltage VPP according to an active signal ACTIVE indicating an operation state of the semiconductor memory device. The active signal ACTIVE indicates that a bank of the semiconductor memory device is enabled.

Figure 2:
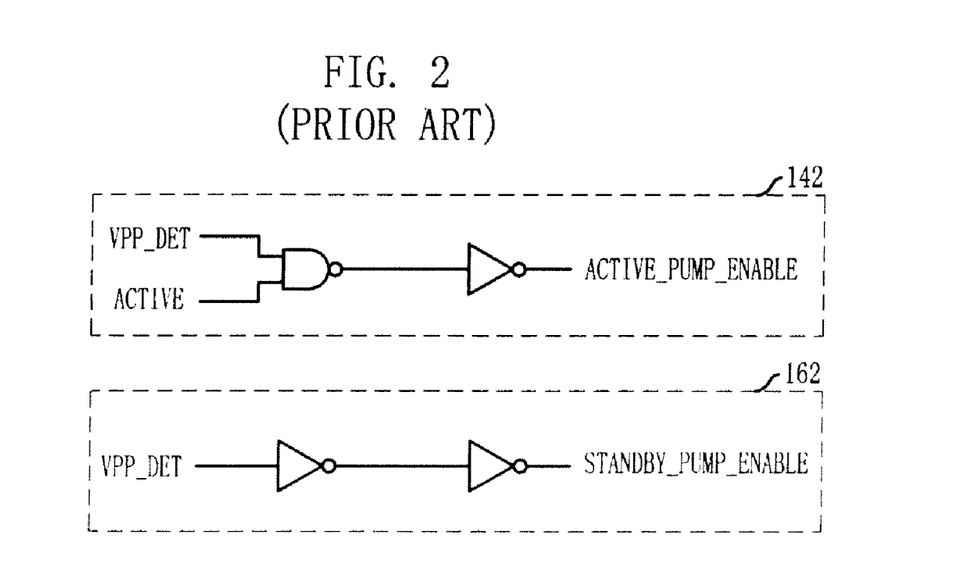
FIG. 2 is a circuit diagram illustrating a controller of an active pumping unit and a controller of a standby pumping unit in FIG. 1.

FIG. 2 is a circuit diagram illustrating a controller 142 of the active pumping unit 140 and a controller 162 of the standby pumping unit 160 in FIG. 1.

Referring to FIG. 2, the active pumping unit 140 operates only when the bank is enabled. The active pumping unit 140 includes a first controller 142 for enabling the pumping operation only when both the active signal ACTIVE and the pumping determining signal VPP_DET are activated. Specifically, the active pumping unit 140 performs the pumping operation only when an active pumping enable signal ACTIVE_PUMP_ENABLE outputted from the first controller 142 is activated to a logic high level.

On the other hand, the standby pumping unit 160 performs the pumping operation in response to the pumping determining signal VPP_DET when the voltage level of the high voltage VPP is below the predetermined level, regardless of the enabling of the bank. A second controller 162 of the standby pumping unit 160 buffers the pumping determining signal VPP_DET to output a standby pumping enable signal STANDBY_PUMP_ENABLE. The standby pumping unit 160 may be implemented with two inverters as illustrated in FIG. 2.

Figure 3:
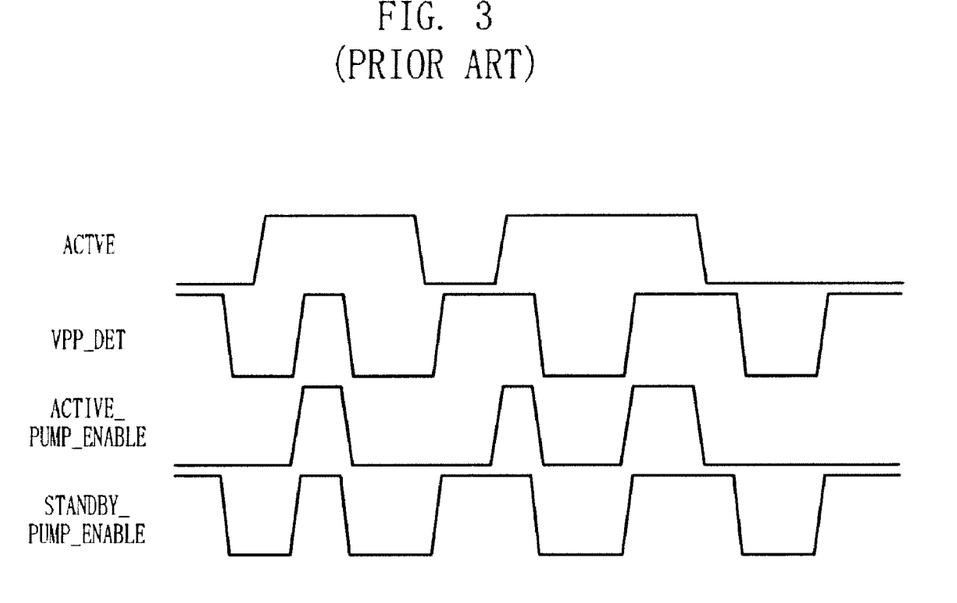
FIG. 3 is a timing diagram illustrating an operation of the semiconductor memory device of FIG. 1.

FIG. 3 is a timing diagram illustrating an operation of the semiconductor memory device of FIG. 1.

Referring to FIG. 3, the active pumping unit 140 and the standby pumping unit 160 are enabled by the active signal ACTIVE indicating the enabling of the bank and the pumping determining signal VPP_DET indicating that the voltage level of the high voltage VPP is below the predetermined level. When the bank is enabled, the high voltage VPP is used in word lines and various internal circuits of the semiconductor memory device and thus the active pumping unit 140 needs to be enabled.

Upon driving the pumping circuit, if a bank active interval is shortened due to the increase of the operating speed of the semiconductor memory device, the consumption of the high voltage VPP increases suddenly while the bank is enabled. As a result, the active pumping unit 140 may not cope with the sudden consumption of the high voltage VPP. Moreover, as the chip size increases, the time delay occurs in transferring the pumping determining signal VPP_DET to the active pumping units 140 of the chip. As the operating speed of the semiconductor memory device, the time delay cannot be ignored. Due to the time delay, a timing when the pumping circuit is enabled does not coincide with a timing when the consumption of the high voltage VPP. Consequently, the voltage level of the high voltage VPP becomes unstable.

SUMMARY OF THE INVENTION

Embodiments of the present invention are directed to providing a semiconductor memory device, which can maintain a stable high voltage using an auxiliary pumping unit for performing a pumping operation in case where the voltage level of the high voltage is below a predetermined level at a time point where a bank can be enabled even if a time delay occurs during the pumping operation or an operating margin is insufficient after an activation of a bank when the high voltage is internally generated by pumping a power supply voltage in a semiconductor memory device, and a method for operating the same. In accordance with an aspect of the present invention, there is provided a semiconductor memory device comprising a high voltage detecting circuit configured to detect a voltage level of a high voltage and activate a pumping determining signal when the voltage level of the high voltage is below a predetermined level; a pumping circuit configured to perform a pumping operation in response to the pumping determining signal and an active signal; and an auxiliary pumping circuit configured to perform the pumping operation in response to the pumping determining signal and a bank active pulse signal.

In electronic devices and semiconductor memory devices, the internal voltage generating circuit pumps a power supply voltage to generate a high voltage necessary for an internal operation. However, a voltage level of the high voltage may become unstable if the operation margin is insufficient after the bank is enabled. Also, if the high voltage does not reach a predetermined level when the bank is enabled, even though the operation margin is sufficient, the internal voltage generating circuit does not cope with the sudden consumption of the high voltage when the bank is enabled, and thus the voltage level of the high voltage may also become unstable. The unstable high voltage may degrade the reliability and stability of the semiconductor memory device. In order to overcome this limitation, the auxiliary pumping circuit is enabled to maintain the high voltage at a stable voltage level when the voltage level of the high voltage is below a predetermined level when the bank is enabled. Specifically, the pumping operation is performed using the active signal and the bank pulse signal.

DESCRIPTION OF SPECIFIC EMBODIMENTS

Hereinafter, an internal voltage generating circuit and a method for operating the same in accordance with the present invention will be described in detail with reference to the accompanying drawings.

Figure 4:
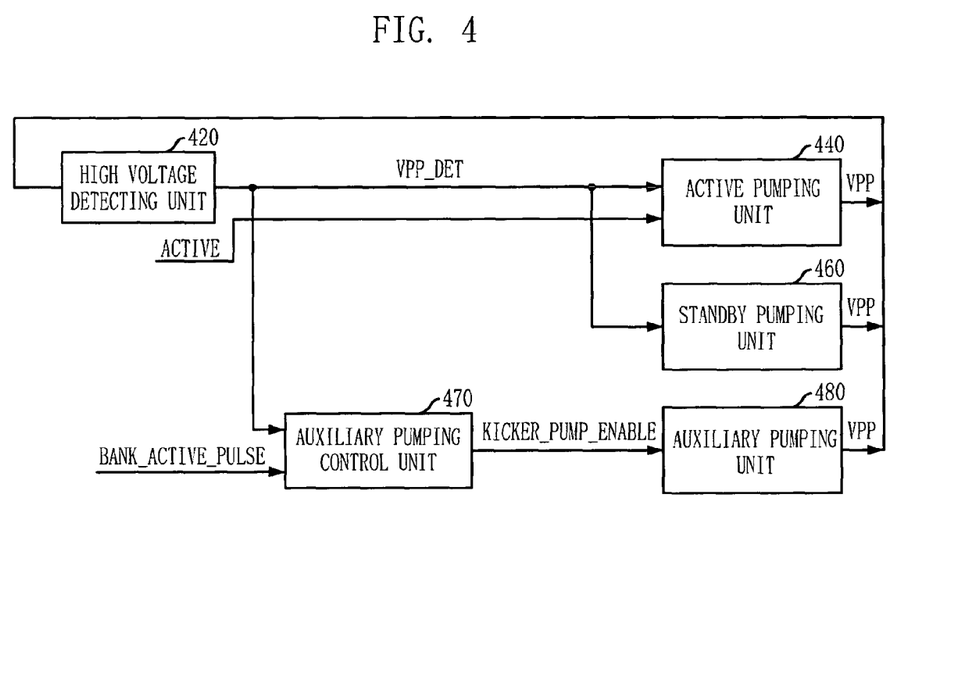
FIG. 4 is a block diagram of a semiconductor memory device in accordance with an embodiment of the present invention.

FIG. 4 is a block diagram of a semiconductor memory device in accordance with an embodiment of the present invention.

Referring to FIG. 4, the semiconductor memory device includes a high voltage detecting circuit 420, a pumping circuit, and an auxiliary pumping circuit. The high voltage detecting circuit 420 detects a voltage level of a high voltage VPP and outputs a pumping determining signal VPP_DET when the detected voltage level of the high voltage VPP is below a predetermined level. The pumping circuit performs a pumping operation in response to the pumping determining signal VPP_DET and an active signal ACTIVE. The auxiliary pumping circuit performs a pumping operation in response to the pumping determining signal VPP_DET and a bank active pulse signal BANK_ACTIVE_PULSE. The pumping circuit includes an active pumping unit 440 and a standby pumping unit 460. The active pumping unit 440 performs a pumping operation when the pumping determining signal VPP_DET and the active signal ACTIVE are activated. The standby pumping unit 460 performs a pumping operation when the pumping determining signal VPP_DET is activated. The auxiliary pumping circuit includes an auxiliary pumping control unit 470 and an auxiliary pumping unit 480. The auxiliary pumping control unit 470 is enabled in response to a bank active pulse signal BANK_ACTIVE_PULSE to output an auxiliary pumping enable signal KICKER_PUMP_ENABLE having a predetermined activation duration according to the enabling of the pumping determining signal VPP_DET. The auxiliary pumping unit 480 performs a pumping operation in response to the auxiliary pumping enable signal KICKER_PUMP_ENABLE.

Since the operations of the active pumping unit 440 and the standby pumping unit 460 are similar to those of the conventional active pumping unit and the standby pumping unit, detailed description thereof will be omitted. Unlike the related art, the semiconductor memory device in accordance with the embodiment of the present invention includes the auxiliary pumping control unit 470 and the auxiliary pumping unit 480. Like the standby pumping unit 460, the auxiliary pumping unit 480 performs the pumping operation when the pumping determining signal VPP_DET is activated to a logic high level. A detailed description about the auxiliary pumping unit 480 will be omitted. An operation of the auxiliary pumping control unit 470 will be described below.

Unlike the active pumping unit 440 and the standby pumping unit 460, the auxiliary pumping control unit 470 receives the bank active pulse signal BANK_ACTIVE_PULSE. The active signal ACTIVE is inputted to the active pumping unit 440 is activated while the bank is enabled. The bank active pulse signal BANK_ACTIVE_PULSE is a reference pulse signal when activating the active signal ACTIVE. Unlike the active signal ACTIVE, the bank active pulse signal BANK_ACTIVE_PULSE is not a signal indicating if the bank is actually enabled, but a signal indicating a timing point when the bank can be enabled for performing a read operation or a write operation. Therefore, the auxiliary pumping control unit 470 controls the auxiliary pumping unit 480 to perform the pumping operation when the pumping determining signal VPP_DET is activated because the voltage level of the high voltage VPP is below the predetermined level at the time point where the back active pulse BANK_ACTIVE_PULSE is inputted.

In addition to the active pumping unit 440 and the standby pumping unit 460, the auxiliary pumping unit 480 is also enabled to maintain the voltage level of the high voltage VPP when the voltage level of the high voltage VPP may be lowered because the activation duration of the bank is shortened and a large amount of the high voltage VPP is consumed within a short time. Therefore, in generating the high voltage VPP in response to the pumping determining signal VPP_DET outputted from the high voltage detecting circuit 420, the auxiliary pumping unit 480 can cope with the increased use of the high voltage VPP even though the pumping operation margin is insufficient because of the short activation duration of the active signal ACTIVE.

Figure 5:
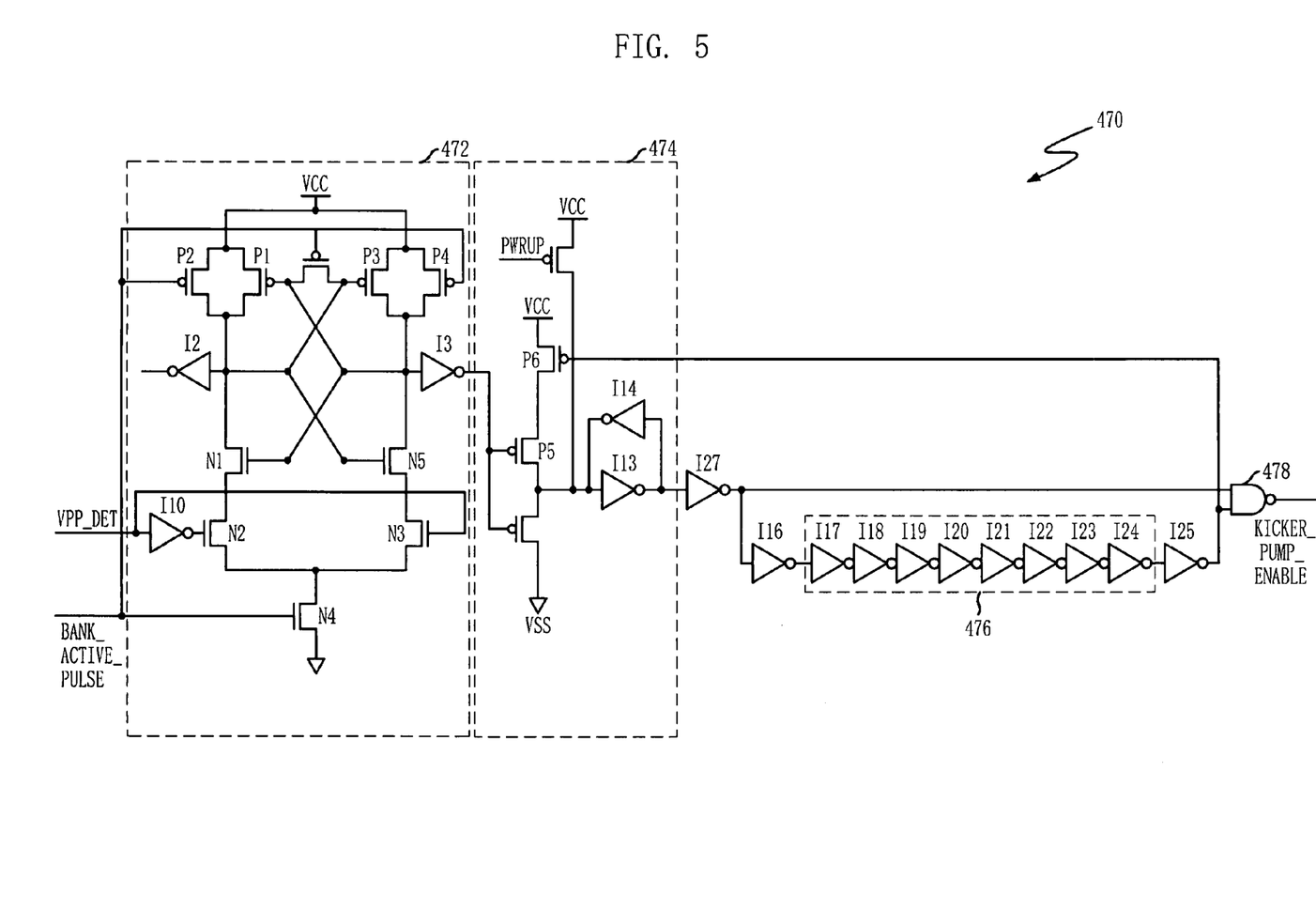
FIG. 5 is a circuit diagram of an auxiliary pumping control unit illustrated in FIG. 4.

FIG. 5 is a circuit diagram of the auxiliary pumping control unit 470 illustrated in FIG. 4.

Referring to FIG. 5, the auxiliary pumping control unit 470 includes an edge trigger 472, a state latch 474, and a pulse generator. The edge trigger 472 transfers the activated pumping determining signal VPP_DET in response to the bank active pulse signal BANK_ACTIVE_PULSE. The state latch 474 latches an output signal of the edge trigger 472 when the auxiliary pumping enable signal KICKER_PUMP_ENABLE is deactivated after the power supply voltage is supplied. The pulse generator receives the output signal of the state latch 474 to generate the auxiliary pumping enable signal KICKER_PUMP_ENABLE having the predetermined activation duration. The pulse generator includes a delay 476 and a logic gate 478. The delay 476 delays the output signal of the state latch 474 for a predetermined time corresponding to the activation duration. The logic gate 478 generates a pulse by performing a logic operation on the output signal of the state latch 474 and an output signal of the delay 476.

The edge trigger 472 includes a cross-coupled latch and a biasing unit. The cross-coupled latch is configured to receive the pumping determining signal VPP_DET and an inverted pumping determining signal. The biasing unit enables the cross-coupled latch in response to the bank active pulse signal BANK_ACTIVE_PULSE. More specifically, the biasing unit N4 is enabled when the bank active pulse signal BANK_ACTIVE_PULSE changes from a logic low level to a logic high level while the pumping determining signal VPP_DET is at a logic low level. In the cross-coupled latch, a third PMOS transistor P2, a fifth PMOS transistor P4, and a first PMOS transistor P0 are turned off. Since the pumping determining signal VPP_DET is at the logic low level, a fourth NMOS transistor N3 is turned off and a third NMOS transistor N2 is turned on, thereby increasing a current Ids in a source region of a second NMOS transistor N1. In response to the pumping determining signal VPP_DET, the fourth NMOS transistor N3 is turned off and the third NMOS transistor N2 is turned on, thereby increasing a voltage level of the source region of the second NMOS transistor N1 and increasing the current Ids of the source region of the second NMOS transistor N1. Since gate voltages of a first NMOS transistor N0 and a fourth PMOS transistor P3 decrease, the first NMOS transistor N0 is turned off and the fourth PMOS transistor P3 is turned on, so that an input signal of a first inverter I0 has a logic high level and an output signal of the edge trigger 472 has a logic low level.

On the contrary, when the pumping determining signal VPP_DET is at a logic high level, the third NMOS transistor N2 is turned off and the fourth NMOS transistor N3 is turned on, thereby decreasing the voltage level of the source region of the first NMOS transistor N0 and the gate voltages of the second PMOS transistor P1 and the second NMOS transistor N1. Therefore, the input signal of the first inverter I0 changes to a logic low level and the output signal of the edge trigger 472 changes to a logic high level.

When the bank active pulse signal BANK_ACTIVE_PULSE is at a logic low level, the biasing unit N4 is turned off. Also, the third PMOS transistor P2, the fifth PMOS transistor P4, and the first PMOS transistor P0 are turned on, so that the input signal of the first inverter I0 changes to a logic high level and the output signal of the edge trigger 472 changes to a logic low level.

The state latch 474 includes a power supply driver, an inverter, and a latch. The power supply driver transfers a core voltage VCC in response to a power-up signal PWRUP. The inverter inverts the output signal of the edge trigger 472 in response to the output signal of the pulse generator. The latch latches the output signal of the inverter and the output signal of the power supply driver. More specifically, when the power supply voltage is applied to the semiconductor memory device, the latch is reset to a logic low level in response to the power-up signal PWRUP of a logic low level. When the output signal of the edge trigger 472 is at a logic low level, that is, the semiconductor memory device is in a standby state or the pumping determining signal VPP_DET is deactivated in response to the bank active pulse signal BANK_ACTIVE_PULSE, a sixth PMOS transistor P5 is turned on and a sixth NPOS transistor N5 is turned off, so that the output signal of the state latch 474 is maintained at a logic low level.

On the contrary, when the output signal of the edge trigger 472 is at a logic high level, the output signal of the state latch 474 changes to a logic high level. When the output signal of the state latch 474 is at the logic high level, the auxiliary pumping enable signal KICKER_PUMP_ENABLE is generated by the pulse generator. The activation duration of the auxiliary pumping enable signal KICKER_PUMP_ENABLE corresponds to a delay time of the delay 476. The pulse generator again transfers the delayed signal to the state latch 474 to initialize the state latch 474 and deactivates the auxiliary pumping enable signal KICKER_PUMP_ENABLE.

Figure 6:
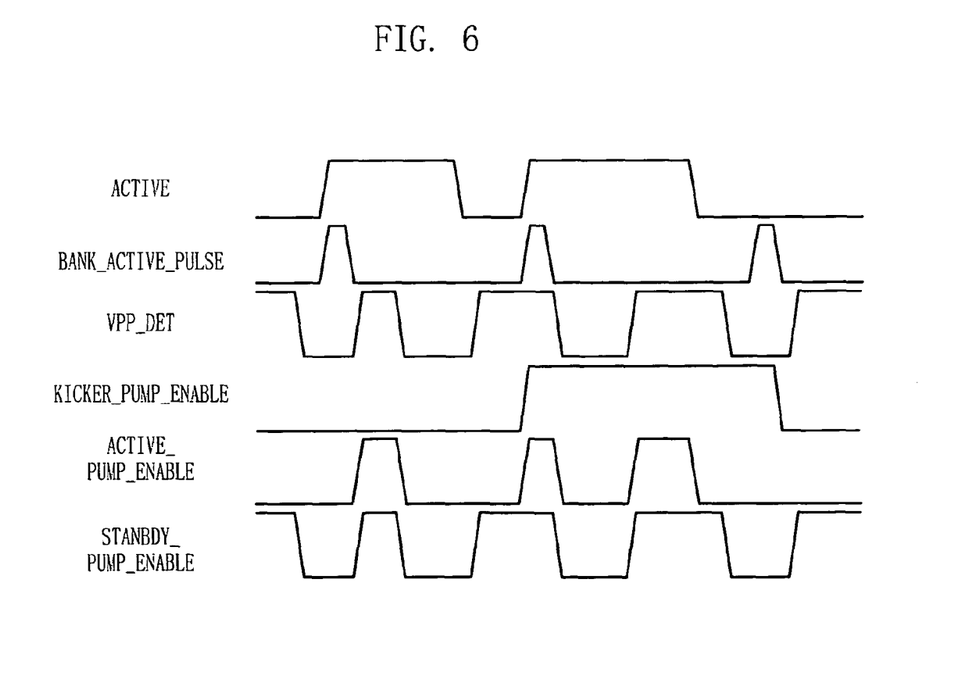
FIG. 6 is a timing diagram illustrating an operation of the semiconductor memory device of FIG. 4.

FIG. 6 is a timing diagram illustrating an operation of the semiconductor memory device of FIG. 4.

Referring to FIG. 6, an auxiliary pumping enable signal KICKER_PUMP_ENABLE is determined according to the state of the pumping determining signal VPP_DET when the bank active pulse signal BANK_ACTIVE_PULSE is received.

The pumping determining signal VPP_DET is a logic low level at a starting time point of a first activation duration of the active signal ACTIVE indicating that the bank is enabled. This means that the voltage level of the high voltage VPP is above a predetermined level at the timing when the bank is enabled. Accordingly, the pumping operation of the auxiliary pumping operation is unnecessary. However, the pumping determining signal VPP_DET is a logic high level at a starting time point of a second activation duration of the active signal ACRIVE. This means that the voltage level of the high voltage VPP is below the predetermined level. Accordingly, an operation of the semiconductor memory device may be instable when the operation of the active pumping unit 440 is delayed. The auxiliary pumping enable signal KICKER_PUMP_ENABLE is activated to enable the auxiliary pumping unit 480 to perform the pumping operation, apart from the pumping operation of the active pumping unit 440. Therefore, the voltage level of the high voltage VPP does not become unstable.

Figure 7:
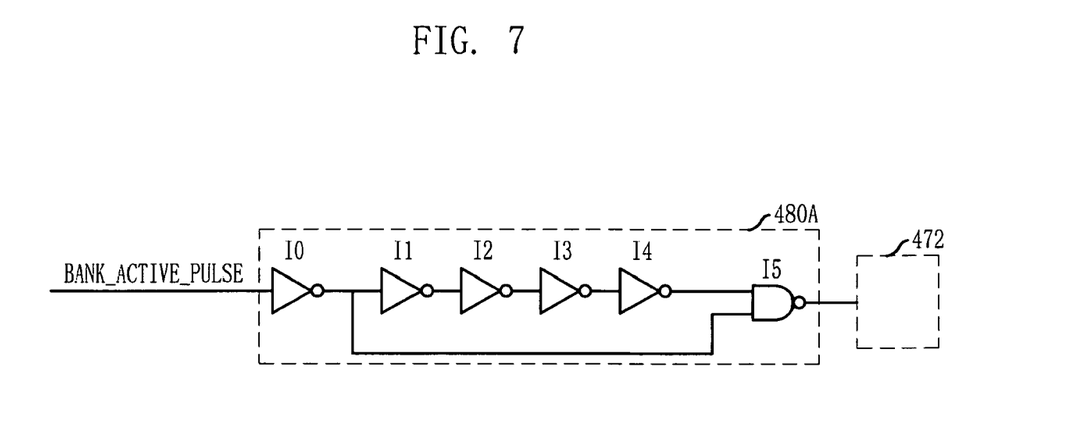
FIG. 7 is circuit diagram of an auxiliary pumping control unit in accordance with another embodiment of the present invention.

FIG. 7 is circuit diagram of an auxiliary pumping control unit in accordance with another embodiment of the present invention.

Referring to FIG. 7, the auxiliary pumping control unit 470 further includes a pulse adjusting unit 480A for adjusting the activation duration of the bank active pulse signal BANK_ACTIVE_PULSE in FIG. 5. The pulse adjusting unit 480A includes an inverter I0, an inverter chain with plurality of inverters I1 to I4, and a NAND gate I5. The inverter I0 inverts the bank active pulse signal BANK_ACTIVE_PULSE. The inverter chain implemented with the inverters I1 to I4 delays an output signal of the inverter I0. The NAND gate I5 performs a NAND operation on the output signal of the inverter I0 and an output signal of the inverter chain. The auxiliary pumping control unit 470 can control the operation of the edge trigger 472 by modulating a pulse width (the activation duration) of the bank active pulse signal BANK_ACTIVE_PULSE.

Figure 8:
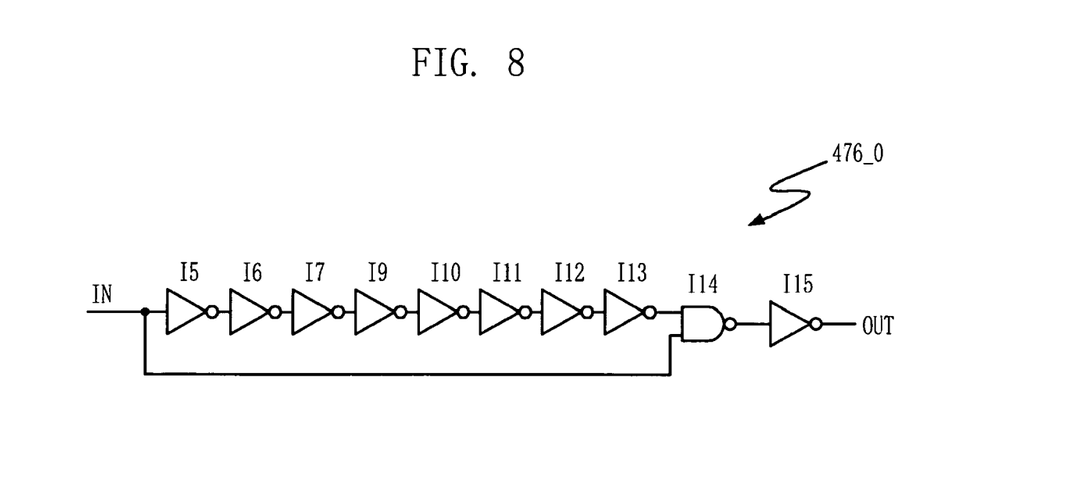
FIG. 8 is a circuit diagram of a delay in accordance with another embodiment of the present invention.

FIG. 8 is a circuit diagram of a delay 476_0 in the auxiliary pumping control unit 470 of FIG. 7 in accordance with another embodiment of the present invention.

Referring to FIG. 8, the delay 476_0 determining the activation duration of the auxiliary pumping enable signal KICKER_PUMP_ENABLE includes an even number of inverters I5 to I13 connected in series, a NAND gate I14 configured to perform a NAND operation on an input signal IN and an output signal of the inverters I5 to I13, and an inverter I15 configured to invert an output signal of the NAND gate. The delay 476_0 delays an input signal during a predetermined time without changing a logic level, and it is to be understood that various changes and modifications may be made without departing from the spirit or scope of the present invention. Although a total delay time of the delay 476_0 determining the activation duration of the auxiliary pumping enable signal KICKER_PUMP_ENABLE is designed to be substantially longer than the period of the bank active pulse signal BANK_ACTIVE_PULSE, the total delay time can be reduced.

As described above, in the semiconductor memory device including the high voltage generating circuit pumping the power supply voltage to generate the high voltage, the voltage level of the high voltage can be maintained even if the time delay occurs during the pumping operation or the operation margin is insufficient after the activation of the bank, thereby improving reliability of the pumping operation.

Further, the semiconductor memory device can generate in advance the high voltage, thereby effectively coping with the sudden consumption of the high voltage due to the reduction of the activation interval.

While the present invention has been described with respect to the specific embodiments, it will be apparent to those skilled in the art that various transpositions, changes, and modifications may be made without departing from the spirit and scope of the invention as defined in the following claims.

What is claimed is:

1. A semiconductor memory device, comprising:
    a high voltage detecting circuit configured to detect a voltage level of a high voltage and activate a pumping determining signal when the voltage level of the high voltage is below a predetermined level;
    a pumping circuit configured to perform a pumping operation in response to the pumping determining signal and an active signal; and
    an auxiliary pumping circuit configured to perform the pumping operation in response to the pumping determining signal and a bank active pulse signal.

2. The semiconductor memory device as recited in claim 1, wherein the active signal is activated during an activation duration of the active signal, and the bank active pulse signal is a reference pulse signal when activating the active signal.

3. The semiconductor memory device as recited in claim 1, wherein the pumping circuit comprises:
    an active pumping unit configured to perform the pumping operation in response to the pumping determining signal and the active signal; and
    a standby pumping unit configured to perform the pumping operation in response to the pumping determining signal.

4. The semiconductor memory device as recited in claim 1, wherein the auxiliary pumping circuit comprises:
    an auxiliary pumping control unit configured to output an auxiliary pumping enable signal having a predetermined activation duration according to the activation of the pumping determining signal when the bank active pulse signal is received; and
    an auxiliary pumping unit configured to perform the pumping operation in response to the auxiliary pumping enable signal.

5. The semiconductor memory device as recited in claim 4, wherein the auxiliary pumping control unit comprises:
    an edge trigger configured to transfer the pumping determining signal in response to the bank active pulse signal;
    a state latch configured to latch an output signal of the edge trigger when the auxiliary pumping enable signal is deactivated after application of a power supply voltage; and
    a pulse generator configured to receive an output signal of the state latch to generate the auxiliary pumping enable signal having the predetermined activation duration.

6. The semiconductor memory device as recited in claim 5, wherein the edge trigger comprises:
    a cross-coupled latch configured to receive the pumping determining signal and an inverted pumping determining signal; and
    a biasing unit configured to enable the cross-coupled latch in response to the bank active pulse signal.

7. The semiconductor memory device as recited in claim 5, wherein the state latch comprises:
    a power supply driver configured to transfer a power supply voltage in response to a power-up signal indicating the application of the power supply voltage;
    an inverter configured to invert the output signal of the edge trigger in response to an output signal of the pulse generator; and
    a latch configured to latch an output signal of the inverter and an output signal of the power supply driver.

8. The semiconductor memory device as recited in claim 5, wherein the pulse generator comprises:
    a delay configured to delay the output signal of the state latch during a predetermined time corresponding to the activation duration of the auxiliary pumping enable signal; and
    a logic gate configured to perform a logic operation on the output signal of the state latch and an output signal of the delay to generate a pulse.

9. The semiconductor memory device as recited in claim 8, wherein the delay comprises an even number of inverters connected in series.

10. The semiconductor memory device as recited in claim 8, wherein the delay comprises:
    an even number of inverters connected in series;
    a NAND gate configured to perform a NAND operation on an input signal and an output signal of the inverters; and an inverter configured to invert an output signal of the NAND gate.

11. The semiconductor memory device as recited in claim 4, wherein the auxiliary pumping control unit comprises:
a pulse adjusting unit configured to adjust an activation duration of the bank active pulse signal
an edge trigger configured to transfer the activated pumping determining signal in response to an output signal of the pulse adjusting unit;
a state latch configured to latch an output signal of the edge trigger when the auxiliary pumping enable signal is deactivated after application of a power supply voltage; and
a pulse generator configured to receive an output signal of the state latch to generate the auxiliary pumping enable signal having the predetermined activation duration.

12. The semiconductor memory device as recited in claim 11, wherein the pulse adjusting unit comprises:
an inverter configured to invert the bank active pulse signal;
a plurality of inverters configured to delay an output signal of the inverter; and
a NAND gate configured to perform a NAND operation on the output signal of the inverter and an output signal of the plurality of inverters.

13. The semiconductor memory device as recited in claim 4, wherein the predetermined time is longer than a period of the bank active pulse signal.

14. A semiconductor memory device, comprising:
a plurality of banks using a high voltage;
a high voltage detecting unit configured to detect a voltage level of the high voltage and activate a pumping determining signal when the voltage level of the high voltage is below a predetermined level; and
a pumping circuit configured to perform a pumping operation in response to the pumping determining signal and a bank active pulse signal indicating a timing point when the banks are enabled for performing a read/write operation.

15. The semiconductor memory device as recited in claim 14, further comprising:
a standby pumping unit configured to perform the pumping operation in response to the pumping determining signal; and
an active pumping unit configured to perform the pumping operation in response to the pumping determining signal and an active signal.

16. The semiconductor memory device as recited in claim 14, wherein the pumping circuit comprises:
an auxiliary pumping control unit configured to output an auxiliary pumping enable signal having a predetermined activation duration according to the activation of the pumping determining signal when the bank active pulse signal is received; and
an auxiliary pumping unit configured to perform the pumping operation in response to the auxiliary pumping enable signal.

17. The semiconductor memory device as recited in claim 16, wherein the auxiliary pumping control unit comprises:
an edge trigger configured to transfer the pumping determining signal in response to the bank active pulse signal;
a state latch configured to latch an output signal of the edge trigger when the auxiliary pumping enable signal is deactivated after application of a power supply voltage; and
a pulse generator configured to receive an output signal of the state latch to generate the auxiliary pumping enable signal having the predetermined activation duration.

18. A method for operating a semiconductor memory device, the method comprising:
detecting a voltage level of a high voltage and activating a pumping determining signal when the detected voltage level of the high voltage is below a predetermined level;
performing a pumping operation in response to the pumping determining signal and a bank active pulse signal indicating a timing point when the banks are enabled for performing a read/write operation; and
performing a read operation and a write operation by using the high voltage.

19. The method as recited in claim 18, further comprising:
performing the pumping operation in response to the pumping determining signal and an active signal.

20. The method as recited in claim 18, wherein the performing of the pumping operation comprises:
outputting an auxiliary pumping enable signal having a predetermined activation duration according to activation of the pumping determining signal when a bank active pulse signal is received; and
performing the pumping operation in response to the auxiliary pumping enable signal.

* * * * *